(12) United States Patent
Castillejo et al.

(10) Patent No.: US 6,882,512 B2
(45) Date of Patent: Apr. 19, 2005

(54) INTEGRATED CIRCUIT PROVIDED WITH A PROTECTION AGAINST ELECTROSTATIC DISCHARGES

(75) Inventors: Armand Castillejo, Grenoble (FR);
Christophe Pinatel, Le Fontanil (FR);
Frédéric Bossu, Grenoble (FR);
Christophe Garnier, Theys (FR)

(73) Assignee: STMicroelectronics S.A., Montrouge (FR)

( * ) Notice: Subject to any disclaimer, the term of this patent is extended or adjusted under 35 U.S.C. 154(b) by 383 days.

(21) Appl. No.: 09/942,271

(22) Filed: Aug. 29, 2001

(65) Prior Publication Data

US 2002/0066907 A1 Jun. 6, 2002

(30) Foreign Application Priority Data

Aug. 30, 2000 (FR) .............................. 00 11075

(51) Int. Cl.[7] ................................. H02H 9/00
(52) U.S. Cl. ............................ 361/56; 361/58; 361/111
(58) Field of Search ........................... 361/56, 58, 111, 361/113, 117, 119, 127

(56) References Cited

U.S. PATENT DOCUMENTS

| | | | |
|---|---|---|---|
| 3,603,865 A | * | 9/1971 | Liebenthal .................. 323/351 |
| 4,858,055 A | | 8/1989 | Okitaka |
| 5,005,061 A | | 4/1991 | Robb et al. |
| 5,086,365 A | * | 2/1992 | Lien ............................. 361/58 |
| 5,534,810 A | * | 7/1996 | White ........................ 327/308 |
| 5,631,793 A | | 5/1997 | Ker et al. |
| 5,654,862 A | * | 8/1997 | Worley et al. .............. 361/111 |

OTHER PUBLICATIONS

French Search Report from French Patent Application 00/11075, filed Aug. 30, 2000.
Mack W.D., et al, "New ESD Protection Schemes For BICMOS Processes With Application To Cellular Radio Designs" San Diego, May 10–13, 1992, New York, IEEE, US, vol. CONF. 25, May 10, 1992.

* cited by examiner

*Primary Examiner*—Stephen W. Jackson
(74) *Attorney, Agent, or Firm*—Lisa K. Jorgenson; James H. Morris; Wolf, Greenfield & Sacks, P.C.

(57) ABSTRACT

An integrated circuit including an output pad, an output block coupled to the output pad via a capacitor, a first one-way conduction element for connecting the pad to a supply line when the voltage on the pad exceeds the voltage of the supply line by a first threshold voltage, a second one-way conduction element for connecting the pad to the circuit ground when the voltage on the pad is smaller than the ground voltage by a second threshold voltage, a resistor coupled on the one hand to the output pad and on the other hand to the supply line via a switch which is turned off when the circuit is idle and which is turned on when the circuit is in a normal operating mode.

25 Claims, 3 Drawing Sheets

INTEGRATED CIRCUIT PROVIDED WITH A PROTECTION AGAINST ELECTROSTATIC DISCHARGES

BACKGROUND OF THE INVENTION

1. Field of the Invention

The present invention relates to integrated circuits protected against electrostatic discharges (ESD), and especially to such circuits provided to have low power consumption outside of their operating phases.

2. Discussion of the Related Art

Conventionally, an integrated circuit includes pads for exchanging signals with the outside and functional blocks connected to these pads. Many elements of these functional blocks, in particular transistors, can be damaged by overvoltages such as electrostatic discharges introduced on the pads by an operator upon handling of the circuit.

FIG. 1 schematically shows an integrated circuit 2. Circuit 2 includes a functional block 4 connected by a node A to an output pad 6. The other functional blocks and the other circuit pads have not been shown. The protection of circuit 2 against electrostatic discharges includes a one-way conduction element 8 arranged between pad 6 and a supply line 10 (VDD). The circuit protection also includes a one-way conduction element 12 arranged between pad 6 and a ground line 14 (GND). The other pads of circuit 2 are connected in the same way by one-way conduction elements to lines 10 and 14.

Element 8 is conductive in the pad-to-supply line direction when the voltage on pad 6 exceeds voltage VDD by a threshold voltage VT1. Similarly, element 12 is conductive in the ground-to-pad direction when the voltage on pad 6 is smaller by a threshold voltage VT2 than the voltage of line 14.

FIG. 2 illustrates the variations of voltage $V_S$ present on pad 6 during an overvoltage $V_{ESD}$ due to a positive electrostatic discharge. Voltage $V_{ESD}$ increases rapidly, for example in 10 ns, to reach a high voltage VMAX, for example on the order of 4000 V, then decreases according to an exponential curve.

In FIG. 2, the scales have not been respected for clarity. Voltage $V_S$ follows curve $V_{ESD}$ as long as $V_{ESD}$<VDD+VT1. When voltage $V_{ESD}$ exceeds voltage VDD+VT1, element 8 is conductive and electrically connects pad 6 and line 10. A clipping device (not shown), arranged between lines 10 and 14, turns on and directs the power of the electrostatic discharge to the ground. Voltage $V_S$ thus does not exceed value VDD+VT1. Similarly, when pad 6 is submitted to a negative overvoltage, voltage $V_S$ does not exceed value GND−VT2. Further, if the overvoltage occurs between a first and a second pad of the circuit, the charge evacuation is performed from one pad to the other via one-way conduction element 8 of the first pad, the clipping device, and one-way conduction element 12 of the second pad, or conversely according to the sign of the overvoltage.

Conventionally, element 8 and element 12 are diodes. Threshold voltages VT1 and VT2 are thus both equal to approximately 0.6 V. Now, in many applications, it is desirable for an integrated circuit to be able to provide an output voltage $V_S$ of high amplitude, for example one or several volts. With the protection device just described, the circuit cannot provide on pad 6 a voltage $V_A$ greater than VDD+VT1 or smaller than GND−VT2 without it being clipped. Therefore, in integrated circuits, the output pad(s) likely to provide a signal of high amplitude are generally left with no protection, with the risk of destruction by electrostatic discharge that this implies.

In French patent application FR-A-2,782,581, the applicant has solved the problem of positive overvoltages by forming, between an output pad and positive supply line VDD, a one-way conduction element having a threshold voltage greater than 0.6 V. This element is formed by connecting N diodes in series, the total threshold voltage being then substantially equal to N×0.6 V.

However, the forming of diode chains for the protection against negative overvoltages is a problem. For element 12, a single diode or, of necessary, two diodes in series, can be used in practice.

To avoid clipping the low voltages of a voltage signal $V_A$ generated by block 4 with a high amplitude, for example with an excursion of twice threshold voltage VDD, conventionally equal to 3 V, a solution consists of choosing a threshold voltage VT1 substantially equal to voltage VDD and of providing from output block 4 a signal $V_A$ having a voltage varying between GND (0 V) and voltage VDD+VT1 (6 V). This solution poses other problems.

FIG. 3 illustrates the variations of such a signal $V_A$. Voltage $V_A$ is a sinusoid of mean value equal to VDD and of excursion 2ΔV, where ΔV<VT1, on either side of voltage VDD. Block 4 is connected to a load 16, external to the circuit. The case where block 4 includes an output amplifying stage including a bipolar transistor 18 having a collector connected to node A and to supply line 10 by an impedance 20, an emitter connected to ground line 14, and a base receiving the signal to be amplified, is considered. The D.C. impedance of inductive resistor 20 is substantially null. If load 16 has a low D.C. impedance $R_I$ between its input and the ground, a relatively high direct current can flow between supply line 10 and the ground via inductive resistor 20 and impedance $R_I$. As an example, if impedance $R_I$ is 18 kΩ, supply voltage VDD being 3 V, the direct current flowing through $R_I$ will be approximately 0.16 mA. Such a current is not acceptable outside of circuit operating phases. Indeed, this direct current permanently flows through inductive resistor 20 and impedance $R_I$, whether circuit 2 is active or not. This overconsumption is particularly disturbing in a battery-supplied device. For example, a cell phone circuit must have, when idle, a maximum consumption of 5 μA.

To solve the problem of overconsumption in the idle state, the applicant has attempted to place a capacitor between load 16 and pad 6. This capacitor conducts the A.C. signal provided by block 4 and prevents the direct current from flowing through $R_I$. Such a capacitor solves the problem. However, this capacitor is a discrete component external to the circuit. It is bulky, expensive, and goes against the constant tendency aiming at a maximum integration of the components.

The applicant has then attempted to form a capacitor in integrated form between pad 6 and block 4. However, the introduction of a capacitor at this location poses the following problems, described in relation with FIGS. 4 and 5.

FIG. 4 very schematically shows a circuit 2' similar to the circuit of FIG. 1, in which same references designate same elements, a capacitor C being connected between node A and pad 6.

FIG. 5 illustrates the variations of voltage $V_S$ on pad 6 of the circuit of FIG. 4 when voltage $V_A$ follows the curve of FIG. 3. The connection between inductive resistor 20 and impedance $R_I$ being cut in direct current by capacitor C, no direct current crosses impedance $R_f$. The D.C. component of voltage $V_S$ is thus null. The A.C. component of voltage $V_S$ is the same as that of voltage $V_A$ and voltage $V_S$ is a sinusoid of amplitude $\Delta V$ having a null mean value. It has been previously seen that voltage VT2 is small (on the order of 0.6 V). If amplitude $\Delta V$ is substantially equal to VDD, the negative halfwaves of voltage $V_S$ will be clipped.

To avoid this, one-way conduction element 12 may be eliminated from the pads intended to provide signals having a high amplitude. This has the disadvantage of decreasing the protection of the circuit, the output pad(s) of which are not protected against negative overvoltages.

SUMMARY OF THE INVENTION

An object of the present invention is to provide an integrated circuit including a complete protection against electrostatic discharges and that can have a reduced power consumption.

Another object of the present invention is to provide such a circuit that uses no discrete components.

To achieve these objects, as well as others, the present invention provides an integrated circuit including an output pad, an output block coupled to the output pad via a capacitor, a first one-way conduction element for connecting the pad to a supply line when the voltage on the pad exceeds the voltage of the supply line by a first threshold voltage, a second one-way conduction element for connecting the pad to the circuit ground when the voltage on the pad is smaller than the ground voltage by a second threshold voltage, further including a resistor coupled on the one hand to the output pad and on the other hand to the supply line via a switch controlled to be turned off when the circuit is idle and to be turned on when the circuit is in a normal operating mode.

According to an embodiment of the present invention, the resistor has a small value as compared to the D.C. impedance of the load likely to be connected to the pad and a large value as compared to the A.C. impedance of the load.

According to an embodiment of the present invention, the switch is a MOS transistor.

According to an embodiment of the present invention, the first one-way conduction element is formed of a group of series-connected diodes.

According to an embodiment of the present invention, the second one-way conduction element includes two series-connected diodes.

According to an embodiment of the present invention, the output block includes a bipolar transistor, the collector of which is connected to the capacitor, the emitter of which is grounded, and the base of which receives the signal to be amplified, and an inductive resistor connected between the collector of the bipolar transistor and the supply line.

The foregoing objects, features and advantages of the present invention, will be discussed in detail in the following non-limiting description of specific embodiments in connection with the accompanying drawings.

DETAILED DESCRIPTION

Figure 1:
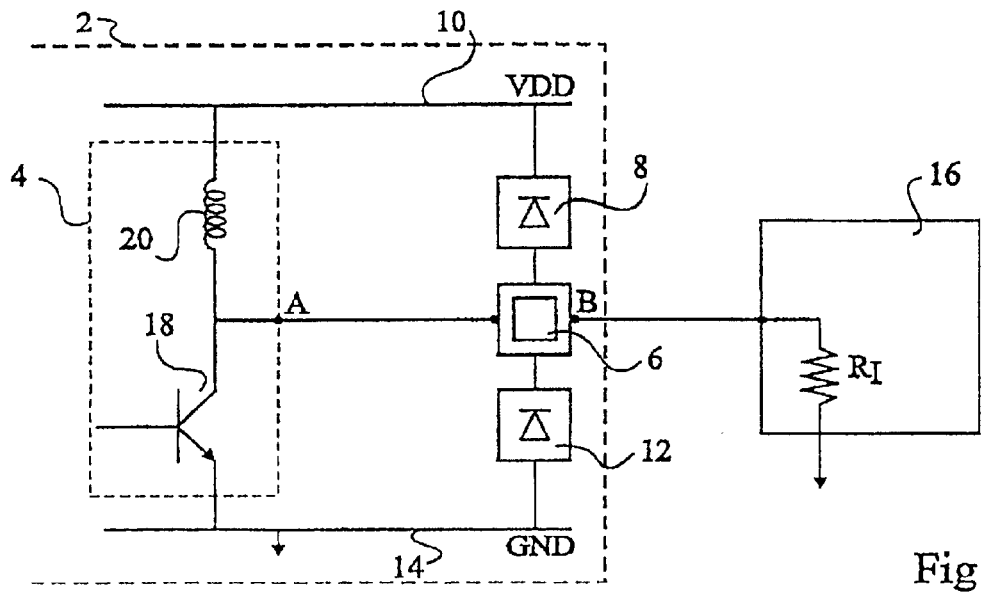
FIG. 1, previously described, schematically shows a conventional integrated circuit provided with a protection against electrostatic discharges.
Figure 2:
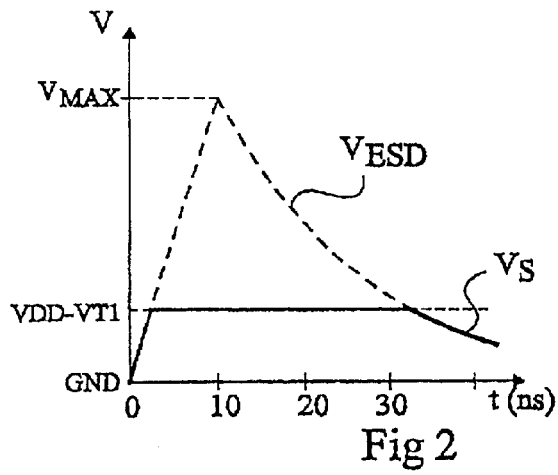
FIG. 2, previously described, illustrates the operation of the protection against electrostatic discharges of the circuit of FIG. 1.

In the drawings, the same references designate the same elements. For clarity, only those elements necessary to the understanding of the present invention have been shown.

Figure 6:
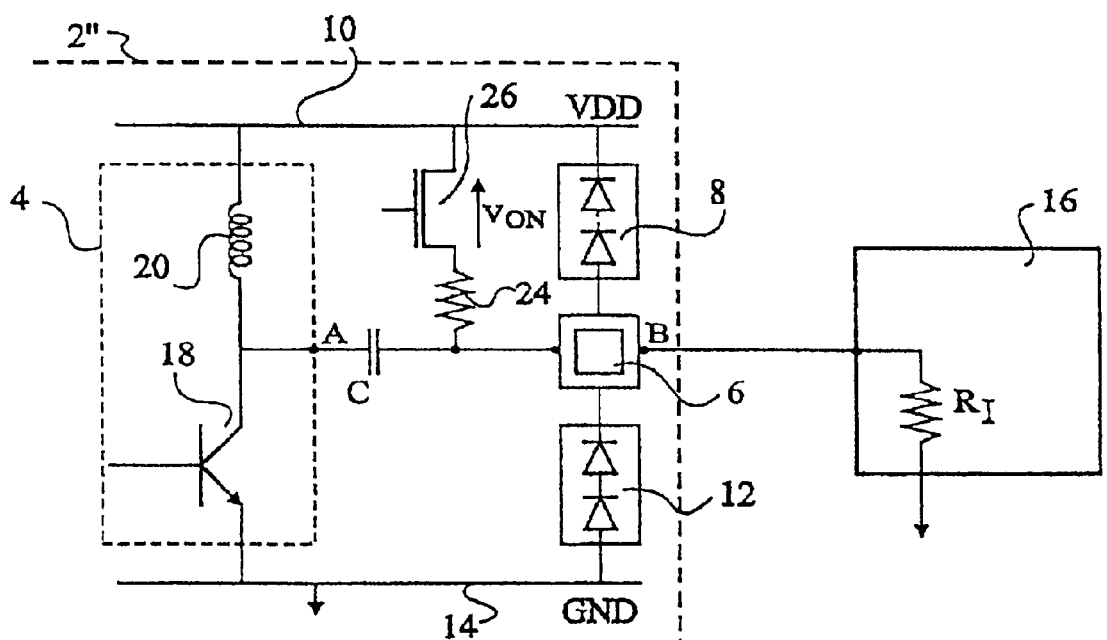
FIG. 6 schematically shows an integrated circuit according to the present invention.

FIG. 6 schematically shows an integrated circuit 2" according to the present invention. The circuit includes an output block 4 connected to an output pad 6 via a capacitor C. Pad 6 is connected to a supply line 10 (VDD) and to a ground line 14 (GND) via one-way conduction elements, respectively 8 and 12. A load 16, external to the circuit, is coupled to pad 6. Load 16 is, for example, a surface acoustic wave (SAW) type filter, coupled to an antenna.

According to the present invention, a first terminal of a resistor 24 is connected to pad 6. The second terminal of resistor 24 is coupled to line 10 via a MOS transistor 26.

When the circuit is in a normal operating mode, transistor 26 is turned on and a direct current flows between line 10 and the ground via transistor 26, in the on state, resistor 24 and D.C. impedance $R_f$ of load 16. Transistor 26 exhibits, in this case, a voltage drop $V_{ON}$ across its terminals. The value of resistance 24 is chosen to be small as compared to the value of impedance $R_f$, so that the voltage drop in resistor 24 is small as compared to the voltage drop in impedance $R_f$. Thus, the D.C. component of voltage $V_S$ of pad 6 is substantially equal to $VDD-V_{ON}$. Conventionally, voltage $V_{ON}$ is on the order of 1 V.

The value of resistance 24 is also chosen to be much greater than the A.C. impedance (not shown) of load 16. Thereby, a small portion only of the A.C. signal provided by block 4 crosses resistor 24 and transistor 26. As an example, the A.C. impedance of load 16 has a value of 50 Ω. If resistance 24 has a value equal to approximately 1 kΩ, resistor 24 and transistor 26 only carry approximately one twentieth of the current of the A.C. signal provided by block 4 to pad 6.

A resistor 24 having such a value occupies a small surface area of the integrated circuit. Further, transistor 26 which, when on, is used to raise the voltage of the D.C. component of voltage $V_S$, can also be a transistor occupying a small surface area. As a result, the device formed by resistor 24 and transistor 26 has a low bulk. Moreover, the device formed by resistor 24 and transistor 26 does not disturb the operation of circuit 2, in particular if circuit 2 operates in the RF range.

Figure 3:
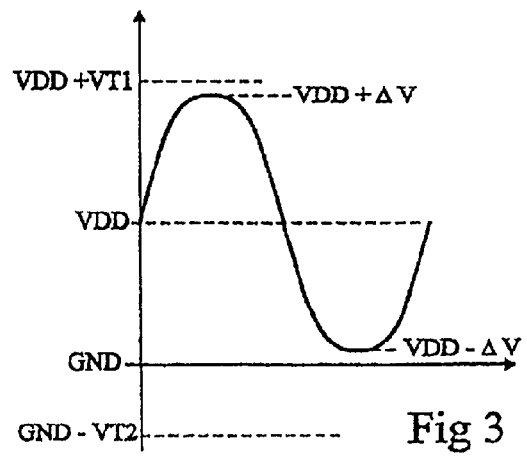
FIG. 3, previously described, illustrates the voltage variations of a signal provided by the circuit of FIG. 1.
Figure 4:
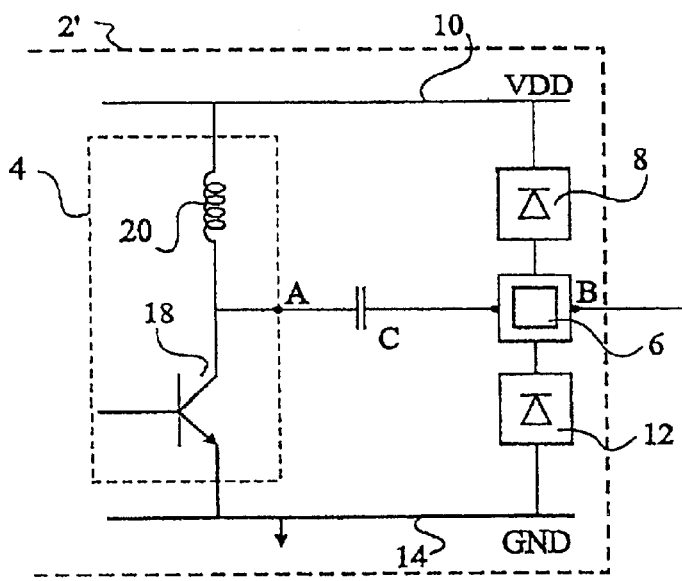
FIG. 4, previously described, schematically shows an integrated circuit provided with a capacitor.
Figure 5:
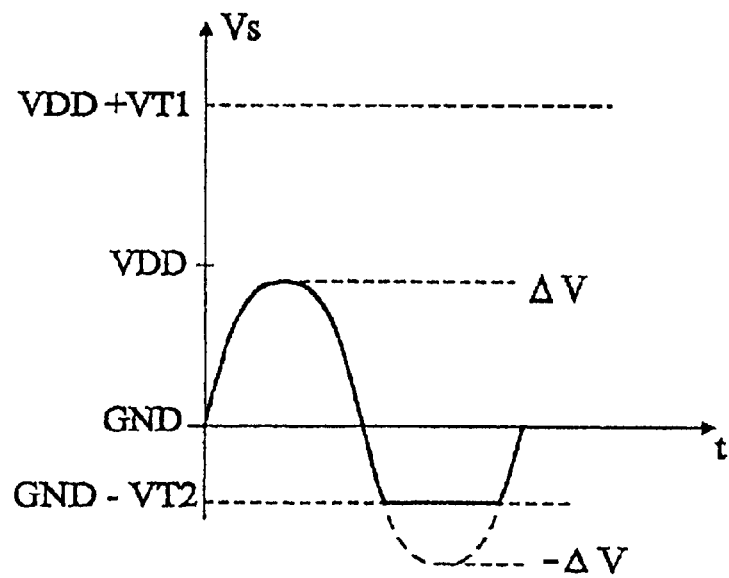
FIG. 5, previously described, illustrates the voltage variations of a signal provided by the circuit of FIG. 4.
Figure 7:
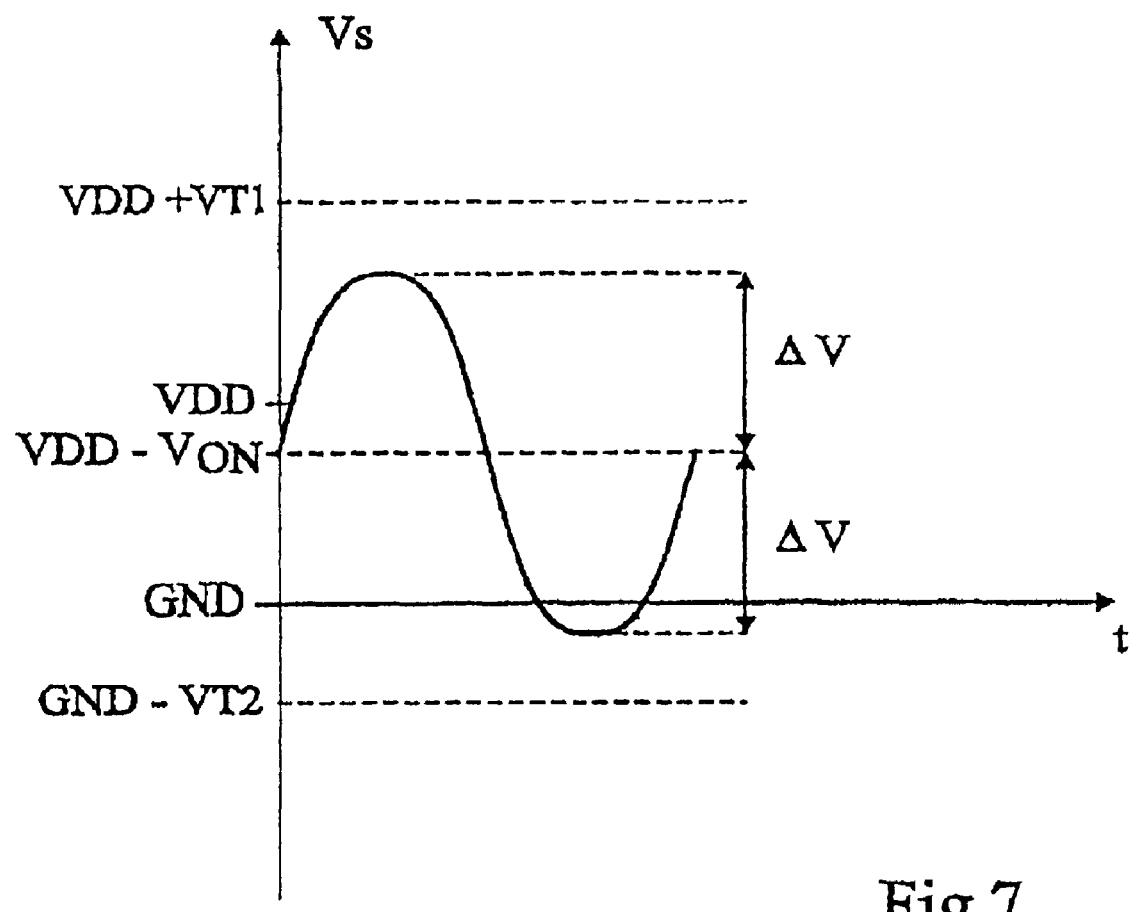
FIG. 7 illustrates the voltage variations of a signal provided by the circuit of FIG. 6.

FIG. 7 schematically illustrates the variations of output voltage $V_S$ of the circuit of FIG. 6 in normal operating mode, for a voltage $V_A$ that follows the curve of FIG. 3. Voltage $V_S$ is a sinusoid, the mean value of which is, as seen previously, equal to $VDD-V_{ON}$, that is, approximately 2 V for $V_{ON}=1$ V. The A.C. components of voltages $V_A$ and $V_S$ are equal, with an amplitude of $\Delta V$. The minimum value reached by value $V_S$ is equal to $VDD-V_{ON}-\Delta V$. If $\Delta V$ is close to VDD, the minimum value of $V_S$ is equal to $-V_{ON}$. According to the present invention, voltage VT2 is chosen so that VT2>$V_{ON}$.

Thus, voltage $V_S$ always remains greater than GND−VT2, and the signal generated by block 4 will not be clipped.

According to the present invention, when the circuit is idle, that is, outside operating phases, transistor 26 is off. Capacitor C isolates load 16 from supply line 10, and no direct current flows through load 16. The circuit power consumption is then minimum.

According to an embodiment of the present invention, one-way conduction device 8 includes a group of diodes in series, for example five diodes, each having a threshold voltage of 0.6 V to obtain a threshold voltage VT1 close to 3 V.

One-way conduction device 12 may include two series-connected diodes, each diode having a threshold voltage of 0.6 V.

Thus, according to the present invention, an integrated circuit having a complete protection against electrostatic discharges is provided, which consumes little power when idle and which, in an normal operating mode, can provide signals having a high amplitude and which are not clipped by the device of protection against electrostatic discharges.

Of course, the present invention is likely to have various alterations, modifications, and improvements which will readily occur to those skilled in the art. In particular, an output block 4 having an output stage including an amplifier comprised of a bipolar transistor and of an inductive resistor has been described, but the present invention applies to any circuit or output stage of an integrated circuit requiring use of a pad with great negative dynamics.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit including:
   an output pad,
   an output block coupled to the output pad via a capacitor,
   a first one-way conduction element for connecting the pad to a supply line when the voltage on the pad exceeds the voltage of the supply line by a first threshold voltage,
   a second one-way conduction element for connecting the pad to the circuit ground when the voltage on the pad is smaller than the ground voltage by a second threshold voltage, and
   a resistor coupled on the one hand to the output pad and on the other hand to the supply line via a switch controlled to be turned off when the circuit is idle and to be turned on when the circuit is in a normal operating mode.

2. The circuit of claim 1, wherein the resistor has a small value as compared to a D.C. impedance of the load likely to be connected to the pad and a large value as compared to the A.C. impedance of said load.

3. The circuit of claim 1, wherein the switch is a MOS transistor.

4. The circuit of claim 1, wherein the first one-way conduction element is formed of a group of series-connected diodes.

5. The circuit of claim 1, wherein the second one-way conduction element includes two series-connected diodes.

6. The circuit of claim 1, wherein the output block includes:
   a bipolar transistor, the collector of which is connected to the capacitor, the emitter of which is grounded, and the base of which receives the signal to be amplified, and
   an inductive resistor connected between the collector of the bipolar transistor and the supply line.

7. A method for driving a load with an AC signal, comprising acts of:
   A) biasing the load with a DC signal only when the AC signal is present; and
   B) preventing the load from drawing power when the AC signal is not present.

8. The method of claim 7, further comprising an act of:
   C) protecting the load from overvoltages and undervoltages of the AC signal.

9. The method of claim 8, wherein the step C) further comprises acts of:
   C1) coupling the AC signal to a voltage source when the AC signal exceeds a first threshold voltage so as to limit a positive cycle of the AC signal; and
   C2) coupling the AC signal to ground when the AC signal goes below a second threshold voltage so as to limit a negative cycle of the AC signal.

10. The method according to claim 9, wherein the DC signal is based at least in part on the first threshold voltage and the second threshold voltage.

11. The method according to claim 10, wherein:
   the act C1) includes an act of coupling the AC signal to the voltage source via a first uni-directional device having the first threshold voltage; and
   the act C2) includes an act of coupling the AC signal to ground via a second unidirectional device having the second threshold voltage.

12. The method according to claim 7, wherein the act B) further comprises an act of:
   capacitively isolating the load from a source of the AC signal when the AC signal is not present.

13. An apparatus, comprising:
   at least one controller to drive a load with an AC signal, the at least one controller configured to bias the load with a DC signal only when the AC signal is present, the at least one controller further configured to prevent the load from drawing power when the AC signal is not present.

14. The apparatus of claim 13, wherein the at least one controller comprises:
   at least one first component coupled to the load and arranged to bias the load with the DC signal only when the AC signal is present; and
   at least one second component coupled to the load and arranged to prevent the load from drawing power when the AC signal is not present.

15. The apparatus of claim 14, wherein the at least one controller further comprises:
   at least one third component coupled to the load and arranged to protect the load from overvoltages and undervoltages of the AC signal.

16. The apparatus of claim 15, wherein the at least one third component comprises:
   a first device coupled to the AC signal and arranged to couple the AC signal to a voltage source when the AC signal exceeds a first threshold voltage so as to limit a positive cycle of the AC signal; and
   a second device coupled to the AC signal and arranged to couple the AC signal to ground when the AC signal goes below a second threshold voltage so as to limit a negative cycle of the AC signal.

17. The apparatus of claim 16, wherein the DC signal is based at least in part on the first threshold voltage and the second threshold voltage.

18. The apparatus of claim 17, wherein:

the first device includes a first uni-directional device having the first threshold voltage; and the second device includes a second uni-directional device having the second threshold voltage.

19. The apparatus of claim 18, wherein each of the first device and the second device comprises at least one diode.

20. The apparatus of claim 16, wherein the at least one first component comprises:

a resistor having a first terminal coupled to the load; and a current generating device having a first terminal coupled to the voltage source and a second terminal coupled to a second terminal of the resistor, the current generating device configured to be responsive to at least one control signal.

21. The apparatus of claim 20, wherein the current generating device comprises at least one MOS transistor.

22. The apparatus of claim 21, wherein the at least one controller is arranged to receive the at least one control signal at a gate terminal of the at least one MOS transistor.

23. The controller of claim 16, wherein the at least one second component comprises:

a capacitor coupled at a first terminal to a source of the AC signal and at a second terminal to the load.

24. A circuit, comprising:

a first uni-directionally conductive device arranged to couple an output of the circuit to a voltage source, the first uni-directionally conductive device having a first threshold voltage;

a second uni-directionally conductive device arranged to couple the output of the circuit to ground, the second uni-directionally conductive device having a second threshold voltage;

a resistor having a first terminal coupled to the output of the circuit; and a transistor having a first terminal coupled to the voltage source and a second terminal coupled to a second terminal of the resistor, the transistor configured to be responsive to at least one control signal so as to protect the output against overvoltages and undervoltages while reducing idle power consumption from the output.

25. A method of protecting an integrated circuit from overvoltages and undervoltages while reducing idle power consumption, comprising steps of:

A) coupling an output node of the circuit to a voltage source using a first uni-directionally conductive element, based on a first threshold voltage of the element;

B) coupling the output node to ground using a second uni-directionally conductive element, based on a second threshold voltage of the element;

C) selectively providing a DC bias to the output node based on the first and second threshold voltages; and D) capacitively isolating the output node when the DC bias is not present.

* * * * *